United States Patent
Su

(10) Patent No.: US 6,821,813 B2
(45) Date of Patent: Nov. 23, 2004

(54) PROCESS FOR BONDING SOLDER BUMPS TO A SUBSTRATE

(75) Inventor: Chao-Yuan Su, Koahsiung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/324,222

(22) Filed: Dec. 19, 2002

(65) Prior Publication Data

US 2004/0121576 A1 Jun. 24, 2004

(51) Int. Cl.[7] .......................... H01L 21/50; H01L 21/44
(52) U.S. Cl. .................. 438/106; 438/117; 438/120; 438/612
(58) Field of Search .............................. 438/106, 107, 438/117, 120, 612–616

(56) References Cited

U.S. PATENT DOCUMENTS

| 4,667,870 A | * | 5/1987 | Avedissian et al. | ......... 228/103 |
| 5,628,111 A | * | 5/1997 | Iwasaki et al. | ................ 29/841 |
| 5,667,129 A | * | 9/1997 | Morita et al. | ................ 228/102 |
| 6,269,999 B1 | * | 8/2001 | Okazaki et al. | .......... 228/110.1 |

* cited by examiner

Primary Examiner—Ha Tran Nguyen
(74) Attorney, Agent, or Firm—Tung & Associates

(57) ABSTRACT

A new and improved process for bonding solder bumps on an IC chip to a BT substrate in "flip chip" packaging technology. In one embodiment, the process includes providing a resilient chip holder on a pressure head and pressing the solder bumps on the inverted IC chip against bond pads on the BT substrate to bond the lead solder bumps to the BT substrate. In another embodiment, the solder bumps of the inverted IC chip are pressed against the BT substrate as the BT substrate is subjected to ultrasonic vibration to bond the solder bumps to the BT substrate. This generates friction-induced small heat affected zones (HAZ) on the substrate and enhances breaking of the tin oxide layer on the solder bumps and bonding of the solder bumps with the substrate.

20 Claims, 2 Drawing Sheets

PROCESS FOR BONDING SOLDER BUMPS TO A SUBSTRATE

FIELD OF THE INVENTION

The present invention relates to packaging of semiconductor integrated circuits. More particularly, the present invention relates to a new and improved process for bonding solder bumps of an IC (integrated circuit) flip chip to a substrate in semiconductor packaging technology.

BACKGROUND OF THE INVENTION

One of the last processes in the production of semiconductor integrated circuits (IC) is multi-leveled packaging, which includes expanding the electrode pitch of the IC chips containing the circuits for subsequent levels of packaging; protecting the chip from mechanical and environmental stress; providing proper thermal paths for channeling heat dissipated by the chip; and forming electronic interconnections. The manner in which the IC chips are packaged dictates the overall cost, performance, and reliability of the packaged chips, as well as of the system in which the package is applied.

Package types for IC chips can be broadly classified into two groups: hermetic-ceramic packages and plastic packages. A chip packaged in a hermetic package is isolated from the ambient environment by a vacuum-tight enclosure. The package is typically ceramic and is utilized in high-performance applications. A chip packaged in a plastic package, on the other hand, is not completely isolated from the ambient environment because the package is composed of an epoxy-based resin. Consequently, ambient air is able to penetrate the package and adversely affect the chip over time. Recent advances in plastic packaging, however, has expanded their application and performance capability. Plastic packages are cost-effective due to the fact that the production process is typically facilitated by automated batch-handling.

A recent development in the packaging of IC chips is the ball grid array (BGA) package, which may be utilized with either ceramic packages or plastic packages and involves different types of internal package structures. The BGA package uses multiple solder balls or bumps for electrical and mechanical interconnection of IC chips to other microelectronic devices. The solder bumps serve to both secure the IC chip to a circuit board and electrically interconnect the chip circuitry to a conductor pattern formed on the circuit board. The BGA technique is included under a broader connection technology known as "Controlled Collapse Chip Connection-C4" or "flip-chip" technology.

Flip chip technology can be used in conjunction with a variety of circuit board types, including ceramic substrates, printed wiring boards, flexible circuits, and silicon substrates. The solder bumps are typically located at the perimeter of the flip chip on electrically conductive bond pads that are electrically interconnected with the circuitry on the flip chip. Because of the numerous functions typically performed by the microcircuitry of a flip chip, a relatively large number of solder bumps are often required. The size of a flip chip is typically on the order of about thirteen millimeters per side, resulting in crowding of the solder bumps along the perimeter of the flip chip. Consequently, flip chip conductor patterns are typically composed of numerous individual conductors that are often spaced apart about 0.1 millimeter or less.

FIG. 1 illustrates a cross-section of a conventional flip chip 10 which is inverted and bonded to a BT substrate 20. Formation of the flip chip 10 begins by forming multiple bonding pads 16 on the surface of a wafer substrate 12, in electrical contact with integrated circuits (not shown) fabricated on the wafer substrate 12. A solder bump 18 is then bonded to each of the bonding pads 16. Each of the solder bumps 18 is typically spherical in configuration and extends through a passivation layer 14 formed on the surface of the wafer substrate 12. A tin oxide layer 19 may coat the surface of each solder bump 18. Finally, the flip chip 10 is subjected to a re-flow temperature of typically about 320° C. to re-flow the lead solder bumps 18 on the wafer substrate 12, after which the flip chip 10 is inverted and the solder bumps 18 are bonded with a BT substrate 20. The re-flow heat partially melts the tin oxide layer 19 and bonds the underlying lead solder bumps 18 to the BT substrate 20.

Several disadvantages are inherent in the conventional process for forming the flip chip 10 in electrical contact with the BT substrate 20. For example, in many cases the BT substrate 20 is incapable of withstanding the high reflow temperatures used to bond the solder bumps 18 to the BT substrate 20. Furthermore, the spherical shape of the solder bumps 18 increases the likelihood of bump bridges forming between adjacent solder bumps 18, particularly for fine bump pitch products. Accordingly, a new and improved method is needed for bonding solder bumps to a BT substrate in the packaging of IC chips.

An object of the present invention is to provide a new and improved process for packaging IC chips.

Another object of the present invention is to provide a new and improved process for bonding solder bumps of a flip chip to a BT substrate.

Yet another object of the present invention is to provide a new and improved flip chip bonding process which prevents the formation of bump bridges during the process of bonding solder bumps of a flip chip on a BT substrate in flip chip packaging.

Another object of the present invention is to provide a new and improved process for bonding solder bumps to a BT substrate in flip chip packaging technology, which process includes applying downward pressure to an inverted flip chip to generate small heat affect zones (HAZ) which provide sufficient heat to facilitate sufficient bonding of the solder bumps to the substrate.

Still another object of the present invention is to provide a new and improved process for bonding solder bumps to a BT substrate in flip chip packaging technology, which process includes applying downward pressure to an inverted flip chip in combination with ultrasonic vibration of the substrate to generate small heat affect zones (HAZ) which provide sufficient heat to facilitate sufficient bonding of the solder bumps to the substrate.

A still further object of the present invention is to provide a process for the packaging of IC chips, which process prevents overheating of BT substrates in the bonding of solder bumps to a BT substrate during flip chip packaging.

Another object of the present invention is to provide a flip chip packaging process which utilizes column-shaped solder bumps to electrically connect integrated circuits on a wafer substrate with a BT substrate in order to prevent the formation of bump bridges between the solder bumps.

Yet another object of the present invention is to provide a reliable process for bonding solder bumps on a wafer substrate to a BT substrate in a flip chip packaging process.

SUMMARY OF THE INVENTION

In accordance with these and other objects and advantages, the present invention is generally directed to a new and improved process for bonding solder bumps on an IC chip to a BT substrate in "flip chip" packaging technology. In one embodiment, the process includes forming solder bumps on an IC chip in electrical contact with integrated circuits on the chip; providing a resilient chip holder on a pressure head; retaining the backside of the chip against the bottom of the chip holder typically using vacuum pressure; and pressing the solder bumps on the chip against bond pads on the BT substrate to break the tin oxide layer on the solder bumps and bond the lead solder bumps to the BT substrate. In another embodiment, the solder bumps of the inverted IC chip are pressed against the BT substrate as the BT substrate is subjected to ultrasonic vibration. This generates friction-induced small heat affected zones (HAZ) on the substrate and enhances breaking of the tin oxide layer on the solder bumps and bonding of the solder bumps with the substrate. In each embodiment, the solder bumps may be column-shaped rather than spherical. The process avoids the use of high-temperature reflow heat that frequently results in heat-induced damage to the BT substrate, and prevents the formation of bump bridges while facilitating self-planarization of the solder bumps on the substrate.

The process of the present invention may utilize a pressure head in combination with a resilient chip holder having a vacuum conduit extending through the thickness thereof. The chip holder is mounted on the pressure head, and the backside of the inverted IC chip adheres to the bottom surface of the chip holder typically by vacuum force as the pressure head presses the solder bumps of the IC chip against the BT substrate. The pressure head is then removed from the IC chip, which is bonded to the BT substrate, typically by terminating the vacuum pressure in the pressure head. The resilient chip holder facilitates self-planarization of the solder bumps on the surface of the BT substrate as the solder bumps are bonded to the BT substrate.

BRIEF DESCRIPTION OF THE DRAWINGS

The invention will now be described, by way of example, with reference to the accompanying drawings, in which.

DESCRIPTION OF THE PREFERRED EMBODIMENTS

The present invention includes a new and improved process for bonding solder bumps on an IC flip chip to a BT substrate. In one embodiment, the process includes applying a downward force to the inverted IC chip against the BT substrate to facilitate attaching the solder bumps on the chip to the BT substrate. The solder bumps may be columnar in shape. In another embodiment, downward force is applied to the IC chip against the BT substrate, in combination with ultrasonic vibration of the BT substrate, in order to generate small heat affect zones (HAZ) on the BT substrate and bonding of the solder bumps to the BT substrate. The process avoids the use of high-temperature reflow heat that frequently results in heat-induced damage to the substrate, and prevents the formation of bump bridges while facilitating self-planarization of the solder bumps on the substrate.

Figure 1:
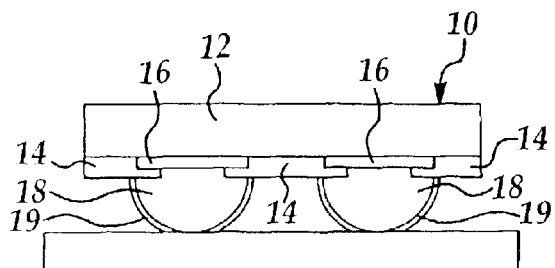
FIG. 1 is a cross-sectional view of a conventional flip chip mounted on a BT substrate (also in cross-section), according to conventional techniques.
Figure 2A:
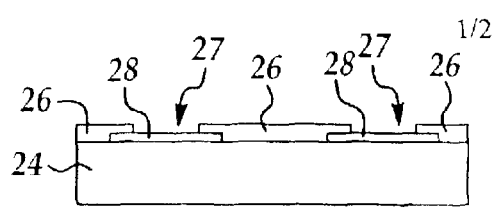
FIG. 2A illustrates a first step in the formation of multiple solder bumps on the surface of a wafer substrate according to the process of the present invention.
Figure 2B:
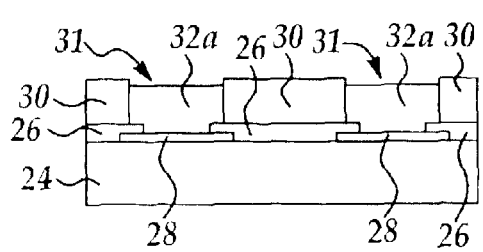
FIG. 2B illustrates a second step in the formation of multiple solder bumps on the surface of a wafer substrate according to the process of the present invention.
Figure 2C:
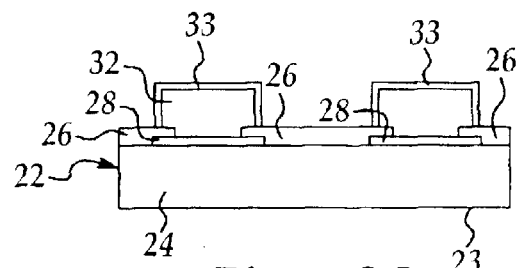
FIG. 2C illustrates a third step in the formation of multiple solder bumps on the surface of a wafer substrate according to the process of the present invention.

Referring initially to FIGS. 2A–2C, an IC (integrated circuit) "flip chip" 22, shown in FIG. 2C, is fabricated according to the process of the present invention, as follows. First, as shown in FIG. 2A, bonding pads 28 are attached to the surface of a wafer substrate 24, in electrical contact with integrated circuits (not shown) previously fabricated on the wafer substrate 24 through numerous processing steps. A passivation layer 26 is then formed on the wafer substrate 24 typically by conventional methods. As further shown in FIG. 2A, the passivation layer 26 partially covers the bonding pads 28, leaving each bonding pad 28 uncovered through a passivation layer opening 27. A DFR (dry film resist) layer 30 is then formed on the surface of the passivation layer 26. The bonding pads 28 remain uncovered through respective DFR openings 31 extending through the DFR layer 30. Lead solder bumps 32 (FIG. 2C), each typically having a column shape, are bonded to the respective bonding pads 28 typically using conventional high-lead solder plating techniques, in which molten lead 32a is deposited into the respective DFR openings 31, as shown in FIG. 2B. It is understood that the solder bumps 32 in any of the embodiments herein may alternatively have a generally spherical shape. After the molten lead 32a hardens and sets in the respective DFR openings 31, the DFR layer 30 is removed, or stripped, from the passivation layer 34, typically according to conventional techniques. The DFR stripping step leaves the column-shaped solder bumps 32 on the IC chip 22, as shown in FIG. 2C. As a last step in the process, a tin oxide layer 33 may be formed on the solder bumps 32, typically in conventional fashion.

Figure 3A:
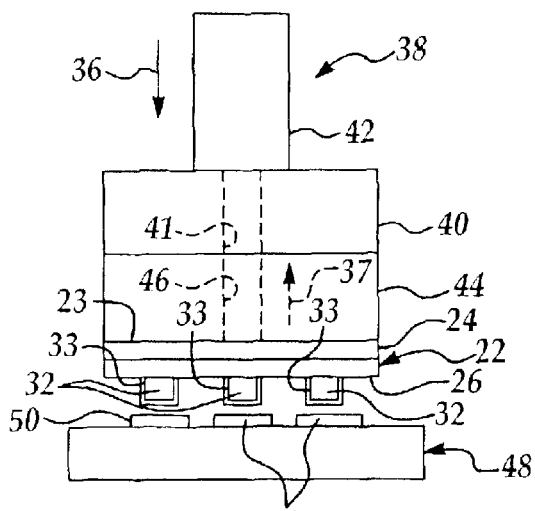
FIG. 3A illustrates mounting of a flip chip (in cross-section) to a pressure head by vacuum pressure and attachment of the flip chip to a BT substrate (also in cross-section) by downward force applied to the flip chip by the pressure head in implementation of the present invention.
Figure 3B:
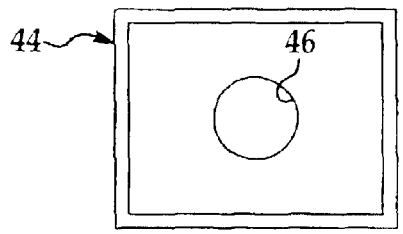
FIG. 3B is a top view of a resilient chip holder used for holding the flip chip on a pressure head by vacuum pressure during attachment of the flip chip to a BT substrate in implementation of the present invention.

Referring next to FIGS. 3A and 3B, the solder bumps 32 on the IC flip chip 22 are bonded to respective bond pads 50 on the surface of a BT substrate 48 using a pressure head 38, as hereinafter described. The pressure head 38 includes a base 40 which is provided on the lower end of a vacuum conduit 42. A vacuum opening 41 extends vertically through the base 40, in fluid communication with the vacuum conduit 42. The vacuum conduit 42 is connected to a vacuum pump (not shown). A resilient chip holder 44, which is typically constructed of rubber, is mounted on the bottom surface of the base 40. As shown in FIG. 3B, the chip holder 44 may be rectangular in shape, but may alternatively have a circular or other configuration which is consistent with the use requirements for the chip holder 44. A vacuum opening 46 extends centrally through the thickness or vertical dimension of the chip holder 44, in fluid communication with the vacuum opening 41 of the base 40.

Figure 4:
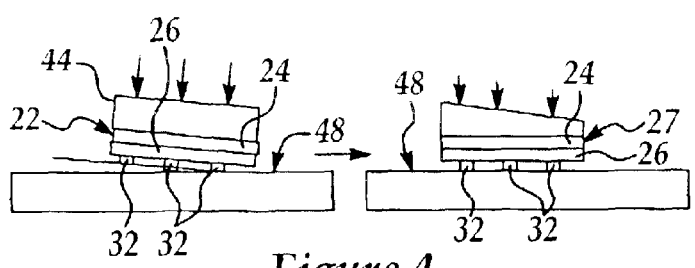
FIG. 4 is a schematic view illustrating self-planarization of a flip chip on a BT substrate in implementation of the present invention.
Figure 5:
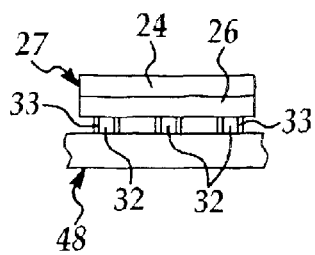
FIG. 5 is a cross-sectional view illustrating attachment of a flip chip to a BT substrate according to a process of the present invention.

Referring next to FIGS. 3A, 4 and 5, after formation of the solder bumps 32 on the wafer substrate 24 as heretofore described with respect to FIGS. 2A–2C, the IC flip chip 22 is inverted, or "flipped", and the backside 23 of the IC flip chip 22 adheres to the bottom surface of the chip holder 44. As shown in FIG. 3A, the inverted flip chip 22 is typically secured to the chip holder 44 by upward vacuum pressure 37 which is applied to the backside 23 of the flip chip 22 through the vacuum conduit 42, the vacuum opening 41 and the vacuum opening 46. A typical vacuum pressure applied to the flip chip 22 is about −5 to about −10 p.s.i. It is understood that alternative techniques known by those skilled in the art may be used to removably retain the flip chip 22 on the chip holder 44. Next, the pressure head 38 presses the solder bumps 32 downwardly against the respective bond pads 50 with a downward pressure 36 of typically about 30–50 psi. As shown in FIG. 4, in the event that the pressure head 38 is disposed at a slight angle "theta" with respect to the BT substrate 48, the resilient chip holder 44 tends to effect self-planarization of the solder bumps 32 on the respective bond pads 50 as the downward force 36 (designated by the letter "F" in FIGS. 4 and 5) is applied to the flip chip 22 by the pressure head 38. This facilitates substantially equal pressure applied against the bond pads 50 by the solder bumps 32. Accordingly, the downward pressure of the solder bumps 32 against the respective bond pads 50 ruptures or breaks the tin oxide layer 33 which coats each solder bump 32 and bonds the solder bumps 32 with the respective bond pads 50, as shown in FIG. 5. Finally, the pressure head 38 is removed from the flip chip 22 by terminating the upward vacuum pressure 37 in the vacuum conduit 42 and the vacuum openings 41 and 46 and lifting the pressure head 38 from the flip chip 22. It will be appreciated by those skilled in the art that the columnar shape of the solder bumps 32 prevents the formation of bump bridges which are characteristic of conventional spherical-shaped solder bumps.

Figure 6A:
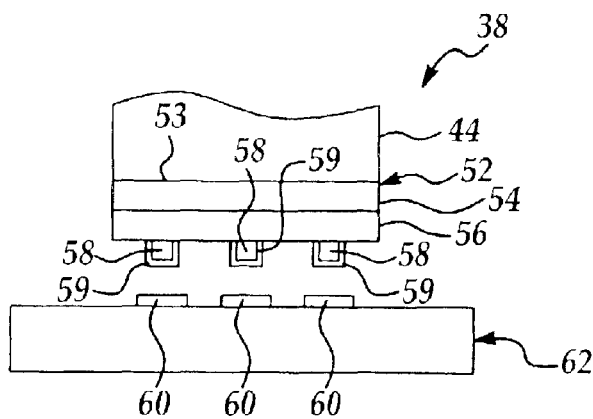
FIG. 6A illustrates vacuum-induced mounting of a flip chip to a pressure head preparatory to bonding the flip chip to a BT substrate according to a second embodiment of the present invention.
Figure 6B:
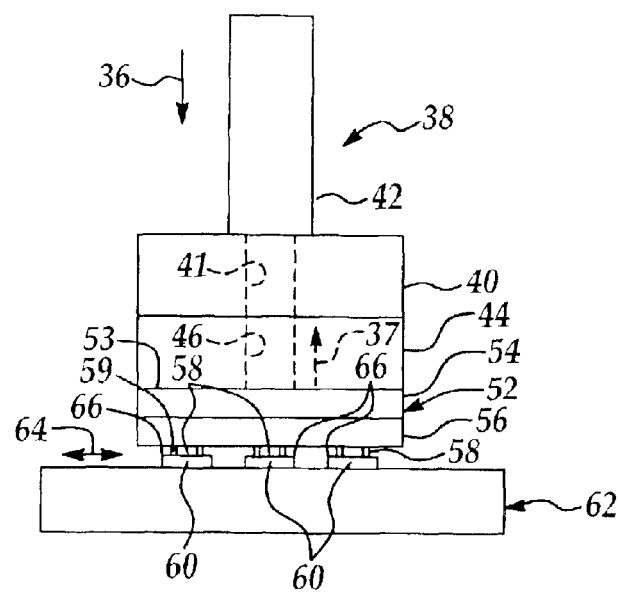
FIG. 6B illustrates bonding of the flip chip to the BT substrate by downward force applied to the flip chip in combination with ultrasonic vibration of the BT substrate.
Figure 6C:
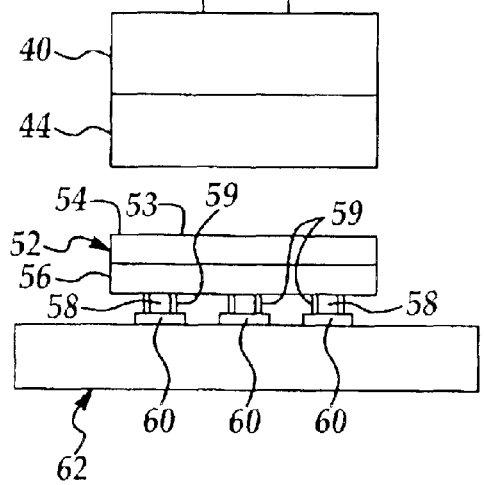
FIG. 6C illustrates removal of the pressure head from the flip chip after bonding of the flip chip to the BT substrate.

Referring next to FIGS. 6A–6C, in another embodiment according to the process of the present invention, a flip chip 52 is initially fabricated typically according to the steps heretofore outlined in FIGS. 2A–2C. Accordingly, the flip chip 52 includes a wafer substrate 54 on which multiple integrated circuits (not shown) are fabricated; a passivation layer 56 partially covering the wafer substrate 54; and lead solder bumps 58 bonded to respective bonding pads (not shown) on the surface of the wafer substrate 54. A tin oxide layer 59 typically coats the surface of each solder bump 58. Accordingly, the flip chip 52 is inverted and the backside 53 of the flip chip 52 adheres to the resilient chip holder 44 of the pressure head 38, by upward vacuum pressure 37 of typically about −5 to about −10 p.s.i., in the same manner as heretofore described with respect to FIG. 3A. Next, as the solder bumps 58 are pressed against the respective bond pads 60 on the surface of a BT substrate 62 with a downward pressure 36 of typically about 30–50 p.s.i., the BT substrate 62 is simultaneously subjected to ultrasonic vibration 64, as shown in FIG. 6B. Accordingly, as shown in FIG. 6B, the ultrasonic vibration 64 of the BT substrate 62 induces small heat affect zones (HAZ) 66 between each solder bump 58 and the corresponding bond pad 60, due to the friction between those elements. Each HAZ 66 breaks or disrupts the tin oxide layer 59 which coats each solder bump 58, and provides sufficient heat for bonding of the solder bump 58 to the bond pad 60. The resilient chip holder 44 tends to effect self-planarization of the solder bumps 58 on the respective bond pads 60 as the downward force 36 is applied to the flip chip 52 by the pressure head 38. Finally, the pressure head 38 is removed from the flip chip 52 by terminating the upward vacuum pressure 37 in the vacuum conduit 42 and the vacuum openings 41 and 46 and lifting the pressure head 38 from the flip chip 52. It will be appreciated by those skilled in the art that since the friction-induced HAZ 66 is localized in a relatively small area between each solder bump 58 and the corresponding bond pad 60, thermal-induced damage to the BT substrate 62 is substantially eliminated.

While the preferred embodiments of the invention have been described above, it will be recognized and understood that various modifications can be made in the invention and the appended claims are intended to cover all such modifications which may fall within the spirit and scope of the invention.

What is claimed is:

1. A process for bonding an IC chip having a plurality of solder bumps to a substrate, comprising the steps of:
   providing a pressure head;
   providing a resilient chip holder on said pressure head;
   causing engagement of said chip holder with substantially an entire backside surface of said IC chip; and
   pressing said chip holder against the IC chip and the solder bumps against the substrate to bond the solder bumps to the substrate, wherein said chip holder distributes pressure equally throughout said entire backside surface of said IC chip.

2. The process of claim 1 further comprising the steps of providing a vacuum opening in said chip holder and retaining the IC chip against said chip holder by inducing a vacuum pressure in said vacuum opening.

3. The process of claim 1 wherein said pressing said chip holder against the IC chip comprises pressing said chip holder against the IC chip at a pressure of about 30 psi to about 50 psi.

4. The process of claim 3 further comprising the steps of providing a vacuum opening in said chip holder and retaining the IC chip against said chip holder by inducing a vacuum pressure in said vacuum opening.

5. The process of claim 1 further comprising the step of subjecting said substrate to ultrasonic vibration as the solder bumps are pressed against the substrate.

6. The process of claim 5 further comprising the steps of providing a vacuum opening in said chip holder and retaining the IC chip against said chip holder by inducing a vacuum pressure in said vacuum opening.

7. The process of claim 5 wherein said pressing said chip holder against the IC chip comprises pressing said chip holder against the IC chip at a pressure of about 30 psi to about 50 psi.

8. The process of claim 7 further comprising the steps of providing a vacuum opening in said chip holder and retaining the IC chip against said chip holder by inducing a vacuum pressure in said vacuum opening.

9. The process of claim 2 wherein said vacuum pressure is about −5 psi to about −10 psi.

10. The process of claim 9 wherein said pressing said chip holder against the IC chip comprises pressing said chip holder against the IC chip at a pressure of about 30 psi to about 50 psi.

11. The process of claim 9 further comprising the step of subjecting said substrate to ultrasonic vibration as the solder bumps are pressed against the substrate.

12. The process of claim 11 wherein said pressing said chip holder against the IC chip comprises pressing said chip holder against the IC chip at a pressure of about 30 psi to about 50 psi.

13. A process for fabricating an IC chip and bonding the IC chip to a substrate, comprising the steps of:
providing a wafer substrate comprising a plurality of integrated circuits;
providing a plurality of generally column-shaped solder bumps on said wafer substrate in electrical communication with said plurality of integrated circuits;
providing a pressure head having a base;
providing a resilient chip holder on said base of said pressure head;
causing engagement of said chip holder with substantially an entire backside surface of said IC chip;
pressing said chip holder against said wafer substrate and said solder bumps against the substrate to bond the solder bumps to the substrate, wherein said chip holder distributes pressure equally throughout said entire backside surface of said IC chip.

14. The process of claim 13 further comprising the steps of providing a vacuum opening in said chip holder and retaining the IC chip against said chip holder by inducing a vacuum pressure in said vacuum opening.

15. The process of claim 13 wherein said pressing said chip holder against the IC chip comprises pressing said chip holder against the IC chip at a pressure of about 30 psi to about 50 psi.

16. The process of claim 13 further comprising the step of subjecting said substrate to ultrasonic vibration as the solder bumps are pressed against the substrate.

17. A process for fabricating an IC chip and bonding the IC chip to a substrate, comprising the steps of:
providing a wafer substrate comprising a plurality of integrated circuits;
providing a plurality of generally column-shaped solder bumps on said wafer substrate in electrical communication with said plurality of integrated circuits;
providing a pressure head having a vacuum conduit and a base carried by said vacuum conduit;
providing a resilient chip holder having a vacuum opening on said base of said pressure head;
retaining said wafer substrate on said chip holder by inducing a vacuum pressure of about −5 psi to about −10 psi in said vacuum opening, with said chip holder disposed in contact with substantially an entire backside surface of said wafer substrate; and
pressing said chip holder against said wafer substrate and said solder bumps against the substrate to bond the solder bumps to the substrate, wherein said chip holder distributes pressure equally throughout said entire backside surface of said wafer substrate.

18. The process of claim 17 wherein said pressing said chip holder against the IC chip comprises pressing said chip holder against the IC chip at a pressure of about 30 psi to about 50 psi.

19. The process of claim 17 further comprising the step of subjecting said substrate to ultrasonic vibration as the solder bumps are pressed against the substrate.

20. The process of claim 19 wherein said pressing said chip holder against the IC chip comprises pressing said chip holder against the IC chip at a pressure of about 30 psi to about 50 psi.

* * * * *